United States Patent
Pickens et al.

(10) Patent No.: US 9,461,642 B1
(45) Date of Patent: Oct. 4, 2016

(54) RADIATION-TOLERANT HIGH-SPEED HIGH-VOLTAGE PULSER

(71) Applicant: Southwest Research Institute, San Antonio, TX (US)

(72) Inventors: Keith S. Pickens, San Antonio, TX (US); Robert E. Bolanos, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 14/835,970

(22) Filed: Aug. 26, 2015

(51) Int. Cl.
*H03K 3/00* (2006.01)
*H03K 17/687* (2006.01)
*H03K 17/60* (2006.01)

(52) U.S. Cl.
CPC ........ *H03K 17/6871* (2013.01); *H03K 17/602* (2013.01)

(58) Field of Classification Search
None
See application file for complete search history.

(56) References Cited

U.S. PATENT DOCUMENTS

| | | | | |
|---|---|---|---|---|
| 2012/0007656 A1* | 1/2012 | Summer | ............ | H03K 17/6871 327/432 |
| 2015/0124507 A1* | 5/2015 | Ridder | ............. | H03K 17/04123 327/377 |
| 2015/0380931 A1* | 12/2015 | Gan | ........................ | H03K 17/61 307/11 |

* cited by examiner

*Primary Examiner* — Long Nguyen
(74) *Attorney, Agent, or Firm* — Livingston Law Firm

(57) ABSTRACT

A high-speed high-voltage pulser especially designed to operate in high radiation environments. The pulser uses a primary side driver and switches in front of an isolation gate transformer. The primary side driver and switches provide amplified and fast complementary pulse signals to the transformer. The transformer has top and bottom secondary windings, which respectively receive the complementary signals, and deliver them to secondary side drivers and switches. The switches are implemented with series-connected FETs.

9 Claims, 4 Drawing Sheets

RADIATION-TOLERANT HIGH-SPEED HIGH-VOLTAGE PULSER

GOVERNMENT RIGHTS

This invention was made with government support under Contract No. NNX13AQ20G awarded by the National Aeronautics and Space Administration. The Government has certain rights in the invention.

TECHNICAL FIELD OF THE INVENTION

The following invention relates to pulse generators, and more particularly to a pulse generator that can withstand high levels of radiation, such as in outer space.

BACKGROUND OF THE INVENTION

A "pulse generator" or "pulser" is an electronic device used to inject a pulse into a circuit of interest. Pulsers are commonly used for the purpose of testing digital electronic circuits, but may be useful for any device that operates with a pulse input signal. For example, pulse generators may be used to drive devices such as switches and lasers. Other applications include applying electrical pulses in the fields of material science, medical, physics and chemistry.

A pulser induces changes of state (high to low, or low to high) at appropriate points in a circuit. The pulser may be used to inject a single pulse, a fixed number (burst) of pulses, or a continuous train of pulses.

In simple configurations, pulsers are single-channel devices that provide one output with a single frequency, delay, and width. To produce multiple pulses, these simple pulsers can be ganged in series or in parallel.

More sophisticated pulsers may have various features that allow for control of the pulse repetition rate, pulse width, pulse delay, pulse amplitude and/or the rise time and fall time of the pulses. Pulsers may use digital techniques, analog techniques, or a combination of both techniques to form the output pulses. For example, the pulse repetition rate and duration may be digitally controlled, but the pulse amplitude and rise and fall times determined by analog circuitry in the output stage of the pulser.

For some applications, it may be desirable to provide a pulser that can operate in high radiation conditions. However, much of today's semiconductor devices are prone to various operating issues when exposed to high levels of radiation.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1A:
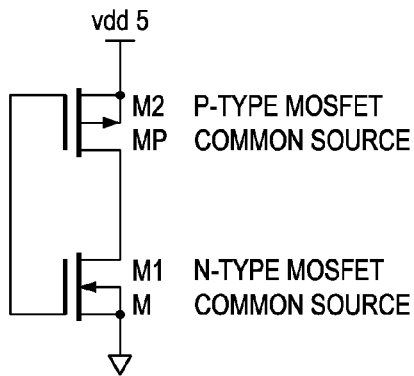
FIGS. 1A and 1B illustrate a complementary P-type and N-type driver and an all N-type FET driver, respectively.

The following description is directed to a radiation-hardened, high-speed, and high-voltage pulser. The pulser is designed to operate in high radiation environments, and in particular, to operate in outer space. An example of an application for the pulser is to provide pulse input to a mass spectrometer on-board a space mission vehicle.

The pulser described herein is specifically designed to operate in space missions directed to Jupiter. In Jupiter's high radiation environment, it is expected that there will be at least 6 Mrad of radiation, and the pulser is designed to operate in this environment.

A challenge in designing a radiation-hardened, high speed, and high-voltage pulser is the selection of suitable parts. The pulser's parts must not only be radiation tolerant, but must also have a sufficiently high voltage rating and fast pulse output. The pulser described herein is capable of withstanding at least 6 Mrad and of switching from 0 to 500 volts within 5 ns while driving a 100 pF capacitive load.

A feature of the pulser is the recognition that high radiation will affect different types of semiconductor circuitry in different ways. For example, CMOS FETs are unsuitable for high radiation environments because the radiation causes a charge to build up in the gate oxide of the FET. As the charge in the gate of the FET builds up, it lowers the FET's threshold voltage, and therefore makes the FET more difficult to turn off. If the charge in the gate is sufficiently high, the FET will be permanently turned on.

As explained below, the pulser described herein uses bipolar transistors for components such as its current source, differential amplifier, and drivers. Bipolar transistors are inherently more radiation tolerant than CMOS FETs because of the lack of a gate oxide interface. Bipolar transistors instead have a junction, and no built-in threshold voltage.

For other components of the pulser, in particular its output switches, the pulser uses gallium nitride (GaN) FETs. These FETs are inherently radiation hardened because their gate dielectric is made from a nitrite insulator, which is naturally leaky. Therefore, a charge trapped in the dielectric of a GaN FET is quickly dissipated from the dielectric. An example of a suitable GaN FET is an enhanced GaN FET, such as the EPC2012 200V eGaN® FET manufactured by Digi-Key Electronics.

Another important property of GaN FETs is their low parasitic capacitance. This allows a GaN FET to switch at a faster speed and higher frequency. The gate-to-drain capacitance (Cgd), also known as the Miller capacitance, is what determines the switching speed of GaN FETs.

A further feature of the pulser is that it avoids the use of P-type FET transistor devices. A P-type transistor is usually used as a voltage source, with an N-type device used as a voltage sink. P-type devices, such as P-channel FETs, are usually not available with a sufficiently high voltage rating for the intended use of the pulser of this description.

Unless otherwise specified herein, all FETs described herein are N-type enhancement GaN FETs. However, the pulser could be easily modified for use with other N-type FETs, such as other GaN FETs and CMOS FETs, although such embodiments are likely to be less radiation tolerant.

Figure 1B:
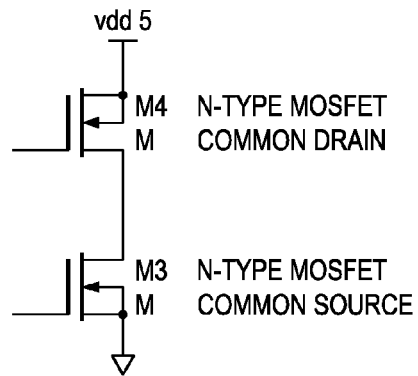

FIGS. 1A and 1B illustrate a conventional complementary P-type and N-type FET driver and an all N-type FET driver, respectively. As explained below, these figures illustrate how the high voltage output switches of the pulser are configured, relative to conventional output switches.

In FIG. 1A, a P-type FET transistor is connected in a common source topology, and an N-type FET transistor is connected in a common source. This produces symmetrical falling and trailing edges.

In FIG. 1B, an all N-type FET driver, the P-type FET of FIG. 1A is replaced with an N-type FET. This FET is connected in a common drain topology. In a common drain topology, the switching speed is determined by the FET's driver.

Figure 2:
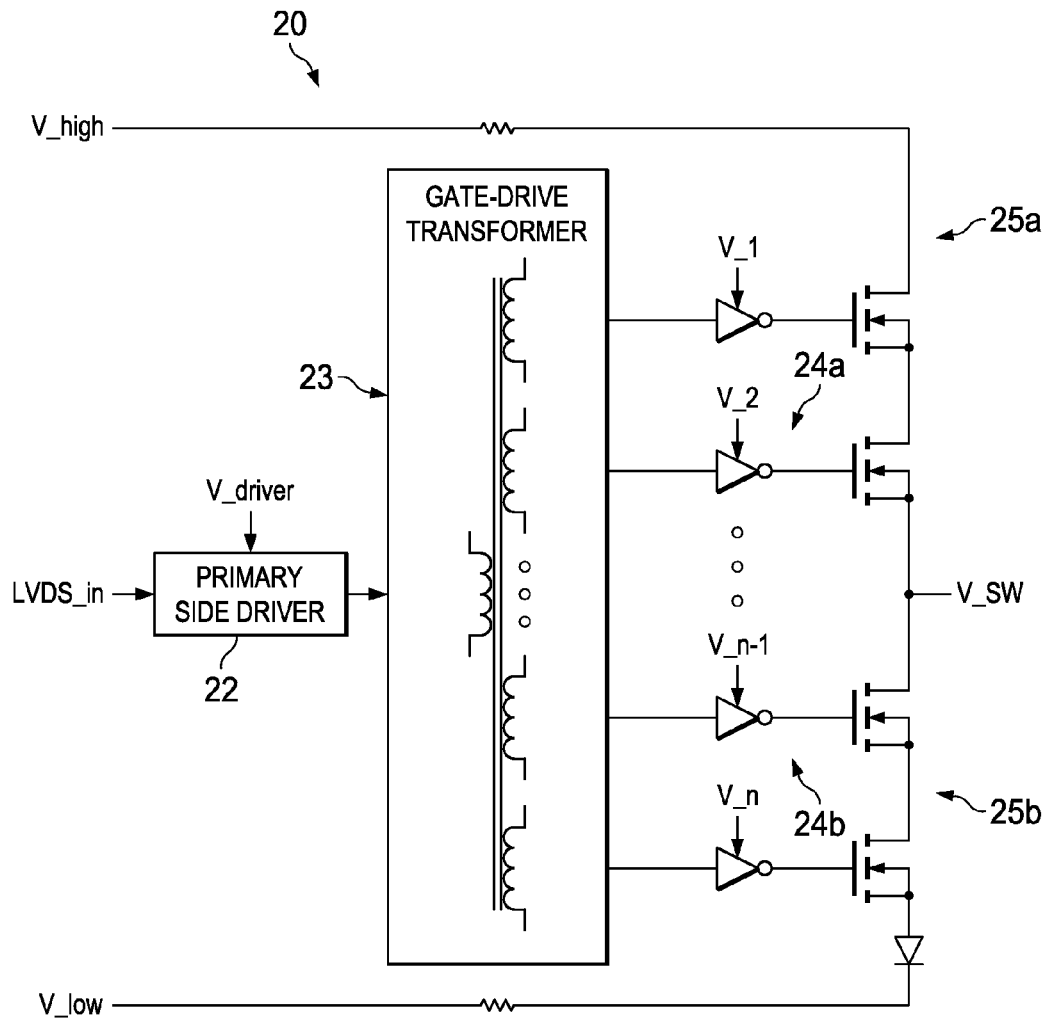
FIG. 2 illustrates the main components of the pulser.

FIG. 2 is a block diagram of the main components of the pulser 20. The input signal is a low voltage differential signal (LVDS), which drives a primary-side driver 22. Primary-side driver 22 is a high current driver that drives the primary side of an isolation gate-drive transformer 23.

Gate-drive transformer 23 copies the output of primary side driver 22 onto a number of secondary-side floating gate drive circuits, identified as a set of upper driver circuits 24a and a set of lower driver circuits 24b. Each drive circuit 24a or 24b is powered from 6V floating output voltage supplies, which are derived from charge pumps.

Each secondary-side drive circuit 24a or 24b drives an output switch, identified as upper output switches 25a and lower output switches 25b. Output switches 25a and 25b comprise FETs in series. By sharing the voltage between series-connected FETs, a much higher voltage rating can be achieved. The upper and lower sets of output switches 25a and 25b are each connected with this series connection.

Thus, the secondary-side drive circuits 24a and 24b are grouped into upper and lower drivers, as are the output switches (FETs) 25a and 25b. For simplicity of illustration, only two drive circuits and two output switches are shown for the upper sets, and two for the lower sets. However, an embodiment more specifically described below has four FETs for the upper set of output switches 25a and four FETS for the lower set of output switches 25b (with a corresponding number of secondary-side drive circuits 24a and 24b). This increases the voltage rating of the pulser 20.

The phases of the lower drivers 24b are 180 degrees out of phase from the phases of the upper drivers 24a. This ensures minimal cross conduction between the upper and lower switches 25a and 25b.

Figure 3:
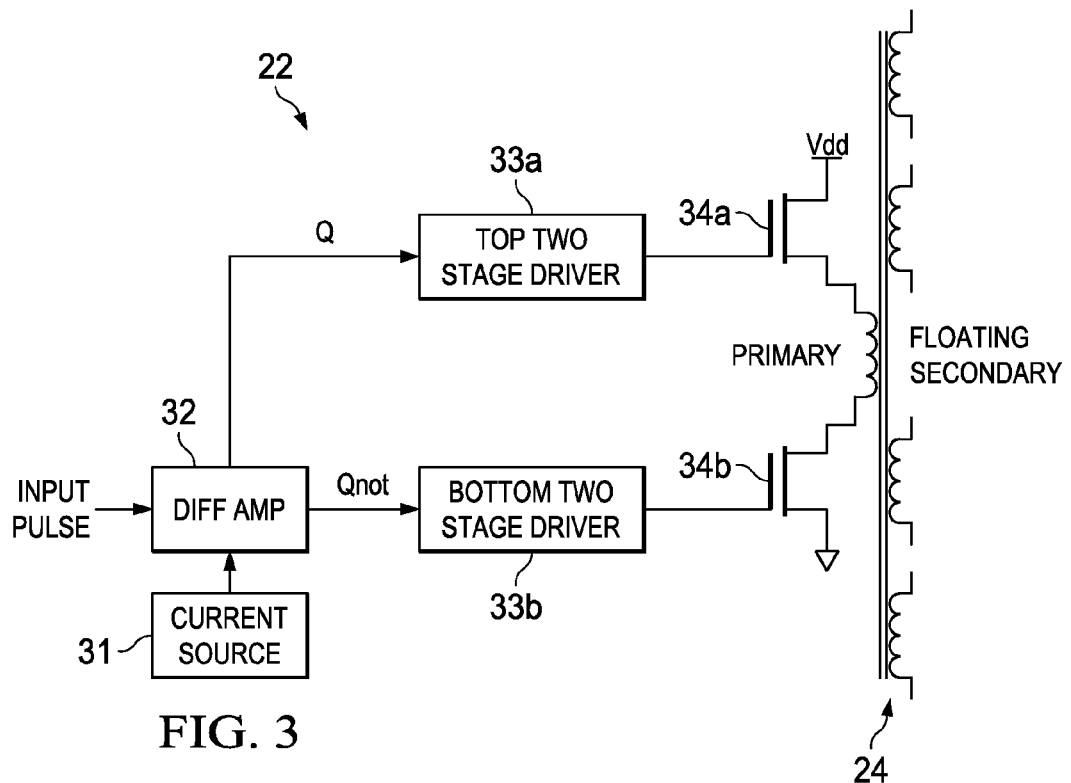
FIG. 3 illustrates the primary-side driver of FIG. 2 in further detail.

FIG. 3 illustrates primary-side driver 22 in further detail. Primary driver 22 comprises a current source 31, a differential amplifier 32, a top and a bottom two-stage driver 33a and 33b, and a top and a bottom output driver 34a and 34b.

Current source 31 is implemented with two base-connected N-type bipolar transistors. These transistors set the current to differential amplifier 32.

Differential amplifier 32 is implemented with two N-type bipolar transistors, which receive the differential LVDS input signal at their base. Differential amplifier has two output signals at the transistor collectors. These output signals are complementary, which means that one output goes active high while the other goes active low.

The output signals from the bipolar transistor collectors of differential amplifier 32 are delivered to the top and bottom two-stage drivers 33a and 33b.

Figure 4:
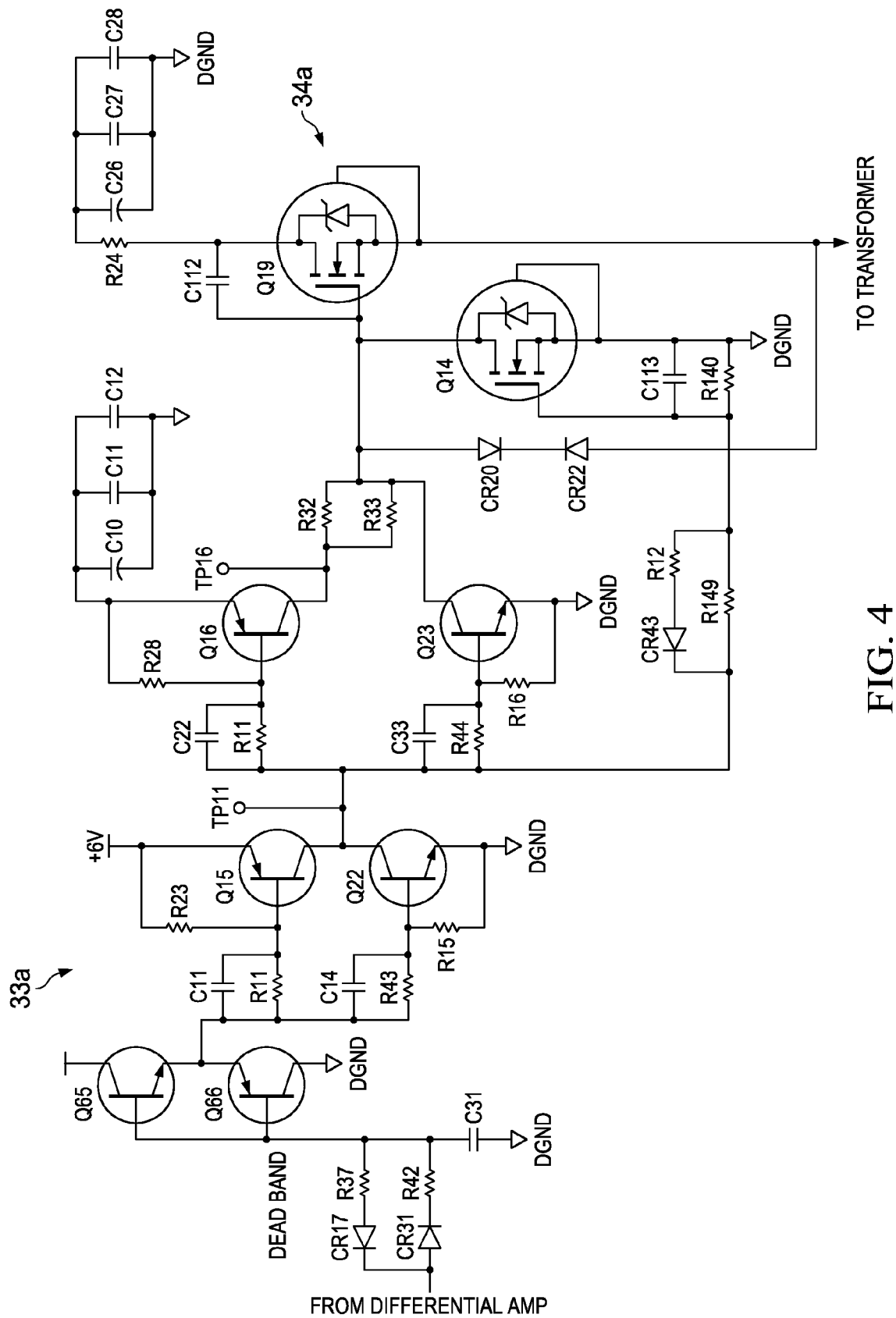
FIG. 4 illustrates the top two-stage driver of FIG. 3 in further detail.

FIG. 4 illustrates, in further detail, the top two-stage driver 33a and its associated FET output driver 34a. Driver 33a comprises bipolar transistors in a complementary bipolar configuration. Top two-stage driver 33a drives its GaN FET output driver 34a connected as a common drain device.

Referring to both FIGS. 3 and 4, the bottom two-stage driver 33b is configured like the top two-stage driver 33a and has similar operation. Bottom two-stage driver 33b drives its GaN FET output driver 34b connected as a common source device. Also, the bottom two-stage driver's power supply is clamped to 5V so that the gate-to-source voltage is not exceeded.

Top and bottom two-stage drivers 33a and 33b have high gain, which is needed to amplify and speed up both the leading and trailing edges of the differential output pulses. Because of the opposite polarity of the signals, the top output switch 34a receives a positive voltage and the bottom output switch 34b receives a low voltage. In the example of this description, the top output switch 34a receives 4V and the bottom output switch 34b receives 0V.

These fast complementary signals are then delivered to the GaN FETs of the respective output switches 34a and 34b. The output signal is coupled through a capacitor to gate-drive transformer 24.

Referring again to FIG. 2, gate-drive transformer 23 couples the pulse signal to secondary-side top and bottom two-stage drivers 24a and 24b. Transformer 23 provides isolation between its primary and the secondary windings, which float to high voltage. There are a total of eight secondary windings, and each winding is connected to its own two-stage complementary bipolar driver. The secondary windings have a top set and a bottom set, which are in opposite phase. In other words, the two sets of windings are reversed so that the signals from the top set of drivers 24a will be opposite from the signals from the bottom set of drivers 24b.

In addition to the driver, each secondary winding has a charge pump consisting of diodes and capacitors. The charge pumps are floating 5V power supplies that ride on the divided high voltage. These charge pumps supply voltage to both the top and bottom two-stage drivers 24a and 24b.

Figure 5:
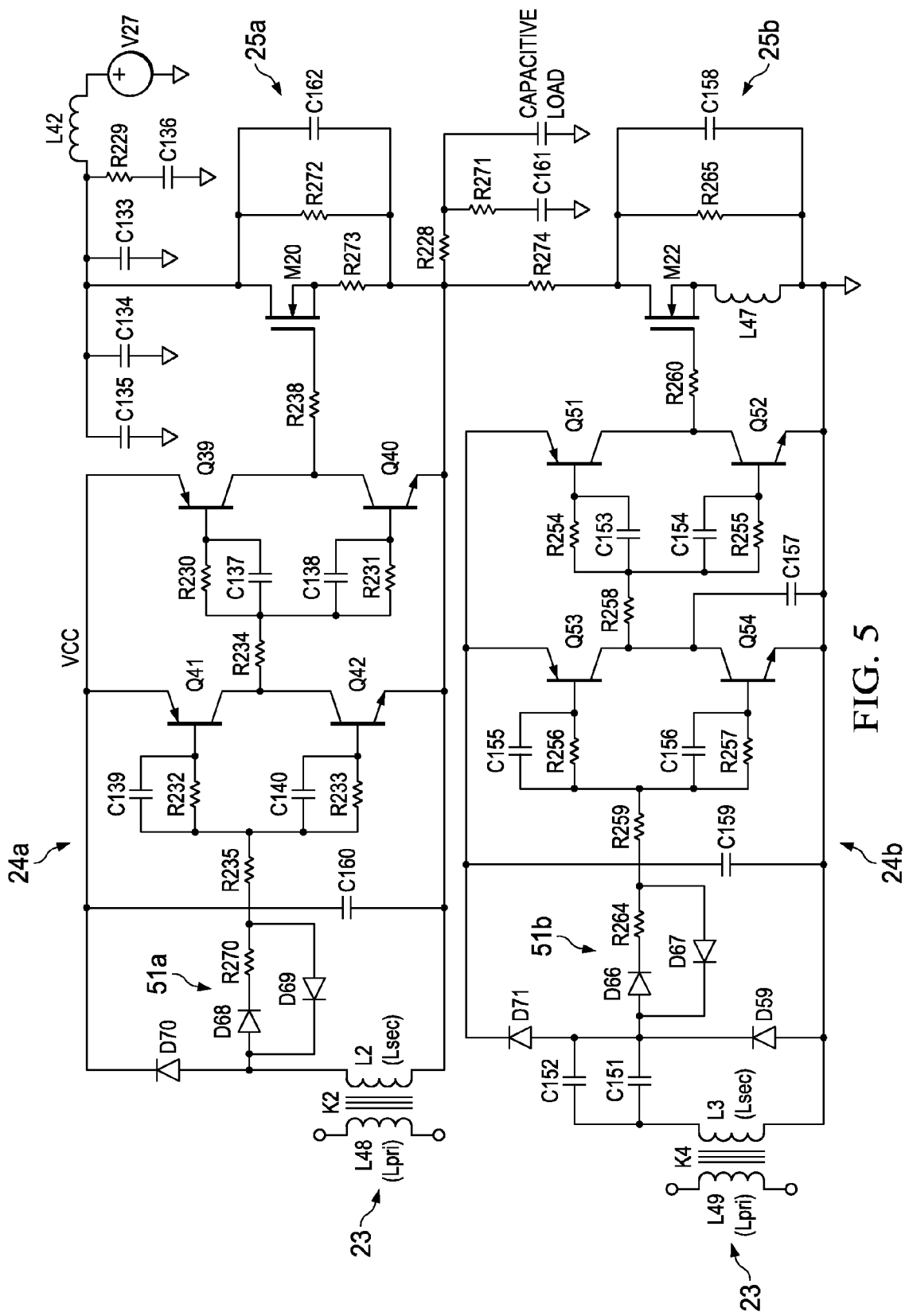
FIG. 5 illustrates one of four top secondary-side drivers of FIG. 2, and its associated FET output switch.

FIG. 5 illustrates the secondary side circuit of FIG. 2 in further detail. For simplicity of illustration, only a single top stage of the drivers 24a and its output FET 25a and a single bottom stage of drivers 24b and its output FET 25b are shown. As explained below, in actual implementation, the top and bottom two-stage drivers 24a and 24b each drive four FETs 25a and 25b stacked in series.

In front of the two-stage drivers 24a and 24b are delay circuits 51a and 51b, consisting of a resistor, capacitor, and diodes. The purpose of each delay circuit is to adjust the timing of output switches 25a and 25b so that cross conduction between these switches is minimized.

The capacitive load of pulser 20 is connected to the source of FET output switch 25a, and to the drain of FET output switch 25b. FET output switch 25a is a source switch that charges the capacitive load when "on". FET output switch 25b is a sink that discharges the capacitive load when "on".

As stated above, pulser 20 is operable to switch from 0 to 500 volts within 5 ns while driving a 100 pF capacitive load. This high-voltage requirement makes it necessary to stack the high-voltage FETs of output switches 25a and 25b in series. This reduces the drain-to-source voltage that each FET sees. More specifically, for the top output switch 25a, four FETs are stacked in a common drain configuration that will act as a source device. For the bottom output switch 25b, four FETs are stacked in a common source configuration that will act as a sink.

Therefore, the maximum voltage applied to each FET is 500 volts divided by four FETs, which yields approximately 125 V per FET. As stated above, an example of a suitable GaN FET is an EPC2012, which has a maximum drain-to-source voltage rating of 200 V. Therefore, the voltage across the drain-source is well within the manufacturer's rating. To help equalize the voltage across the drain-to-source of the FETs, a 180V Zener diode, 10 Megohm resistor, and 20 pF capacitor are added.

In the example of this description, when the top four drivers 24a are on and all four top GaN FETs 25a are on, there is 400V at the V_high input and the V_low input is a ground. The pulser output is 400V.

The four bottom drivers 24b see 400V across all GaN FETs 25b. However, the GaN FETs are only rated to 200V. By using transformer 23, the 400V is equally divided between all four GaN FETs. So each GaN FET only sees 100V. The first GaN FET is ground, the next GaN source, second from the bottom, will have 100V, the third source will have 200V and the fourth will have 300V. So the source of the all the bottom GaN FETs are floating. To turn on all the bottom gates, a Vgs of 4V is applied. The gates are also floating. The bottom Vgate_to_ground is 4V, the second Vgate_to_ground is 104V, the third Vgate_to_ground is 204V, and the fourth Vgate_to_bottom is 304V.

In another embodiment, the GaN FETs of the above-described pulser could be replaced with silicon MOSFETs, with the electronic circuitry being substantially the same. The resulting pulser will have less radiation tolerance, but will operate as a high-speed high-voltage pulser.

What is claimed is:

1. A pulse generator for providing a pulse signal to a capacitive load, comprising:
   a primary-side driver, operable to receive a low voltage differential signal, and having a differential amplifier, a top multi-stage driver and a bottom multi-stage driver, a top primary side output switch, and a bottom primary side output switch;
   wherein the differential amplifier generates complementary output signals, and delivers one to the top multi-stage driver and the other to the bottom multi-stage driver;
   wherein the top multi-stage driver and bottom multi-stage driver comprise multiple stages of complementary bipolar transistors;
   wherein the top primary side output switch and bottom primary side output switch comprise field effect transistors (FETs), and are operable to provide amplified complementary output signals;
   a gate-drive isolation transformer having a primary winding driven by the output signals from the primary side driver, and having a number of secondary windings;
   a set of secondary-side top drivers, each driven by one of the secondary windings, and each comprising multiple stages of complementary bipolar transistors;
   a set of secondary-side bottom drivers, each driven by one of the secondary windings, and each comprising multiple stages of complementary bipolar transistors;
   a top secondary side output switch, comprising a set of FETs arranged in series, each receiving the output of a secondary-side top driver; and
   a bottom secondary side output switch, comprising a set of FETs arranged in series, each receiving the output of a secondary-side bottom driver;
   wherein the top secondary side output switch charges the capacitive load when on, and the bottom secondary side output switch discharges the capacitive load when on.

2. The pulser of claim 1, wherein the FETs are GaN FETs.

3. The pulser of claim 1, wherein the FETs are MOSFETs.

4. The pulser of claim 1, wherein all FETs are N-type FETs.

5. The pulser of claim 1, wherein the top multi-stage driver drives its primary side output switch connected as a common drain device.

6. The pulser of claim 1, wherein the bottom multi-stage driver drives its primary side output switch connected as a common source device.

7. The pulser of claim 1, wherein the FETs of the top secondary side output switch are arranged in a common drain configuration.

8. The pulser of claim 1, wherein the FETs of the bottom secondary side output switch are arranged in a common source configuration.

9. The pulser of claim 1, wherein the top secondary side output switch is a source switch that charges the capacitive load when "on", and the bottom secondary side output switch is a sink that discharges the capacitive load when "on".

* * * * *